United States Patent
Gershman et al.

(10) Patent No.: US 12,317,401 B2
(45) Date of Patent: May 27, 2025

(54) LOW-TEMPERATURE FABRIC DIELECTRIC BARRIER DISCHARGE DEVICES

(71) Applicant: The Trustees of Princeton University, Princeton, NJ (US)

(72) Inventors: Sophia Gershman, Scotch Plains, NJ (US); Yevgeny Raitses, Princeton, NJ (US); Shurik Yatom, Lawrenceville, NJ (US); Phillip Efthimion, Bedminster, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 234 days.

(21) Appl. No.: 18/070,958

(22) PCT Filed: Jun. 2, 2021

(86) PCT No.: PCT/US2021/035346
§ 371 (c)(1),
(2) Date: Nov. 29, 2022

(87) PCT Pub. No.: WO2021/247637
PCT Pub. Date: Dec. 9, 2021

(65) Prior Publication Data
US 2023/0319972 A1   Oct. 5, 2023

Related U.S. Application Data

(60) Provisional application No. 63/033,457, filed on Jun. 2, 2020.

(51) Int. Cl.
H05H 1/24 (2006.01)

(52) U.S. Cl.
CPC ........ H05H 1/2425 (2021.05); H05H 1/2439 (2021.05); *H05H 2245/36* (2021.05)

(58) Field of Classification Search
None
See application file for complete search history.

(56) References Cited

U.S. PATENT DOCUMENTS

| | | | |
|---|---|---|---|
| 4,952,370 A | 8/1990 | Cummings et al. | |
| 7,194,173 B2 * | 3/2007 | Shtein | H10K 30/20 |
| | | | 385/128 |

(Continued)

FOREIGN PATENT DOCUMENTS

| | | |
|---|---|---|
| CN | 1421564 A | 6/2003 |
| CN | 104756334 A | 7/2015 |

(Continued)

OTHER PUBLICATIONS

Jung, Heesoo et al., "Wearable Atmospheric Pressure Plasma Fabrics Produced by Knitting Flexible Wire Electrodes for the Decontamination of Chemical Warfare Agents", Scientific Reports, vol. 7, No. 1, p. 40746, Jan. 18, 2017.

(Continued)

*Primary Examiner* — Srinivas Sathiraju
(74) *Attorney, Agent, or Firm* — MEAGHER EMANUEL LAKS GOLDBERG & LIAO, LLP

(57) ABSTRACT

A fabric dielectric barrier discharge (DBD) device, a textile material comprising interconnected insulated conductive fibers can be used to generate a cold homogenous plasma by forming a discharge path from a conductive core of a first fiber, to a dielectric layer surrounding the conductive core, through an air gap towards, e.g., a second fiber or human skin. When the plasma that lights in and around the air gap comes into contact with a contaminated surface (containing, e.g., bacteria and/or viruses), it induces reactive species to form on the contaminated surface, and the reactive species are then allowed to kill the bacteria and/or viruses.

18 Claims, 8 Drawing Sheets

(56) References Cited

U.S. PATENT DOCUMENTS

| | | | | |
|---|---|---|---|---|
| 8,016,894 | B2* | 9/2011 | Selwyn | D06M 10/025 |
| | | | | 8/115.52 |
| 8,227,051 | B1* | 7/2012 | Paulauskas | D06M 11/34 |
| | | | | 427/113 |
| 8,962,099 | B2* | 2/2015 | Dubreuil | B05D 1/62 |
| | | | | 427/569 |
| 9,005,188 | B2* | 4/2015 | Wandke | A61N 1/0492 |
| | | | | 606/32 |
| 9,330,890 | B2* | 5/2016 | Busse | A61N 1/40 |
| 9,447,205 | B2* | 9/2016 | Paulauskas | D06B 19/00 |
| 10,138,305 | B2* | 11/2018 | Paulauskas | H01J 37/3277 |
| 11,006,994 | B2* | 5/2021 | Krasik | H05H 1/2406 |
| 2004/0022669 | A1* | 2/2004 | Ruan | A61M 1/32 |
| | | | | 422/22 |
| 2006/0147648 | A1* | 7/2006 | De Vries | C23C 16/505 |
| | | | | 118/718 |
| 2008/0193329 | A1* | 8/2008 | Akishev | H05H 1/48 |
| | | | | 422/186.04 |
| 2008/0199629 | A1* | 8/2008 | Simor | D06M 11/83 |
| | | | | 118/620 |
| 2009/0156079 | A1* | 6/2009 | Yahiaoui | D04H 3/005 |
| | | | | 427/551 |
| 2010/0048076 | A1* | 2/2010 | Creyghton | D06M 10/025 |
| | | | | 427/535 |
| 2010/0209293 | A1* | 8/2010 | Ikawa | C02F 1/50 |
| | | | | 422/186 |
| 2012/0046597 | A1* | 2/2012 | Morfill | H05H 1/2406 |
| | | | | 604/20 |
| 2013/0345620 | A1* | 12/2013 | Zemel | H05H 1/2418 |
| | | | | 604/24 |
| 2014/0042130 | A1* | 2/2014 | Descamps | H05H 1/42 |
| | | | | 219/121.5 |
| 2015/0137677 | A1 | 5/2015 | Sohn | |
| 2016/0324442 | A1* | 11/2016 | Zdeblick | A61B 5/0537 |
| 2017/0354453 | A1* | 12/2017 | Krasik | A61B 1/018 |
| 2017/0365377 | A1* | 12/2017 | Yun | H02K 3/30 |
| 2018/0242577 | A1* | 8/2018 | Tsai | A01N 25/00 |
| 2020/0246496 | A1* | 8/2020 | Mazzeo | A23L 3/26 |
| 2020/0305265 | A1* | 9/2020 | Eckert | A61L 2/14 |
| 2021/0022234 | A1* | 1/2021 | Polak | H05H 1/2406 |
| 2021/0137106 | A1* | 5/2021 | Tsai | H05H 1/2406 |
| 2021/0385934 | A1* | 12/2021 | Eckert | A61B 18/042 |
| 2022/0047880 | A1* | 2/2022 | Planard-Luong | A61N 1/44 |
| 2022/0337240 | A1* | 10/2022 | Venkatesh | H03H 1/00 |
| 2023/0146111 | A1* | 5/2023 | Furukawa | A61L 2/10 |
| | | | | 422/186.07 |
| 2023/0262867 | A1* | 8/2023 | Yatom | A61L 2/14 |
| | | | | 422/23 |
| 2023/0319972 | A1* | 10/2023 | Gershman | D03D 1/0088 |
| | | | | 315/111.21 |

FOREIGN PATENT DOCUMENTS

| | | |
|---|---|---|
| CN | 110761067 A | 2/2020 |
| JP | 6625648 B2 | 12/2019 |
| KR | 20180000815 A | 1/2018 |
| KR | 102113925 B1 | 5/2020 |
| WO | 2016114504 A1 | 7/2016 |

OTHER PUBLICATIONS

Laroussi, Mounir, "Nonthermal Decontamination of Biological Media by Atmospheric-Pressure Plasmas: Review, Analysis, and Prospects", IEEE Transactions on Plasma Science, vol. 30, No. 4, pp. 1409-1415, Aug. 2002.

Boekema, B.K.H.L. et al., "Antibacterial plasma at safe levels for skin cells", Journal of Physics D: Applied Physics, vol. 46, No. 42, p. 422001, Sep. 13, 2013.

Xia, T. et al., "Inactivation of airborne viruses using a packed bed non-thermal plasma reactor", Journal of Physics D: Applied Physics, vol. 52, No. 25, p. 255201, Mar. 28, 2019.

Nayak, Gaurav et al., "Rapid inactivation of airborne porcine reproductive and respiratory syndrome (PRRS) virus using an atmospheric pressure air plasma", Plasma Processes and Polymers, vol. 17, No. 10, Feb. 24, 2020.

Brandenberg, Ronny, "Dielectric barrier discharges: progress on plasma sources and on the understanding of regimes and single filaments", Plasma Sources Science and Technology, vol. 26, No. 5, p. 053001, Apr. 3, 2017.

Boekema, B.K.H.L. et al., "A new flexible DBD device for treating infected wounds: in vitro and ex vivo evaluation and comparison with a RF argon plasma jet", Journal of Physics D: Applied Physics, vol. 49, No. 4, p. 044001, Dec. 24, 2015.

International Search Report and Written Opinion for corresponding PCT Application No. PCT/US2021/035346, dated Sep. 27, 2021.

First Office Action for corresponding Chinese Application No. 202180047408.2, dated Dec. 29, 2023.

* cited by examiner

LOW-TEMPERATURE FABRIC DIELECTRIC BARRIER DISCHARGE DEVICES

CROSS-REFERENCE TO RELATED APPLICATIONS

This application claims priority to U.S. Provisional Patent Application No. 63/033,457 filed Jun. 2, 2020; which is hereby incorporated in its entirety by reference.

STATEMENT REGARDING FEDERALLY SPONSORED RESEARCH OR DEVELOPMENT

This invention was made with government support under Grant No. DE-AC02-09-CH11466 awarded by the Department of Energy. The government has certain rights in the invention.

BACKGROUND

There is an urgent need for wide use of sanitizing and disinfecting agents and techniques. Brought into focus the current COVID-19 pandemic, it is no longer limited to medical, pharmaceutical, or food industry, but rather expanded to the decontamination of commonly used surfaces such as doorknobs and devices, such as masks, cell phones, and pens.

A common issue involves fabrics becoming infected. To combat this, many approaches have been taken. Typically, current self-cleaning fabrics acquire their bioactive properties from the addition of chemical sterilizing agents. Fabrics may be impregnated with chemical disinfectants or they may incorporate other materials damaging to viruses and other microbes, such as heavy metals, copper, and a variety of polymers that resist bacterial attachment and growth but do not kills the microorganisms. Other materials under development by others are based on incorporating nanoparticles or nanotubes that acquire biocidal properties when exposed to sunlight, such as for example, titanium nanoparticles. A major drawback of this type of material is the requirement for sunlight. Other nanoparticles that have germicidal properties, such as silver for example, may be incorporated into the fibers, and a variety of polymers can be activated by chemical treatment to create an acidic environment that acts against drug resistant bacteria and viruses. All these methods require an addition of another substance, have temporary activity, and none offer complete disinfection. Instead, all of these materials either slow the growth and/or reduce the bacterial load. Thus, a new approach for providing a disinfecting fabric is needed.

Over the last two decades, cold atmospheric pressure plasmas (CAP) have seen rapid development in the areas of bacterial and viral inactivation and surface disinfection. A recent review summarized the achievements of a broad range of CAP plasma sources, including dielectric barrier discharges (DBD), that effectively inactivate bacteria, viruses, fungi, and bacterial spores.

In spite of these achievements, the only sterilization method that involves plasma, which is currently recommended by the Centers for Disease Control and widely accepted in industry, is a rigid device based on plasma activation of hydrogen peroxide vapor, one of the most effective and clean germicidal chemicals, and one which utilizes vacuum chambers. See U.S. Pat. No. 4,952,370. Hydrogen peroxide does not leave any dangerous residue because its decomposition products are water and oxygen.

The disinfecting and even sterilization effectiveness of plasmas is due to their bioactive properties such as reactive oxygen (ROS) and nitrogen species (RNS), electrons, currents, electric and electromagnetic fields, and UV rays. The mechanisms of bacterial inactivation have been investigated by many groups but remain unclear. The chemical and electrical plasma properties may be affecting a bacterial cell in stages. The electrons and the electric field affect the cell membrane and aid in the cell penetration by the RNSs and some long-lived ROSs. ROS are involved in lipid peroxidation and other oxidative reactions damaging the cell membrane and aiding the transport of RNS/ROS into the cell.

Inside the cell the ROS/RNS damage proteins, lipids, and the DNA. The combined effect of these processes is bacterial cell inactivation. Most of the work on medical and biological applications of DBDs has been conducted on one of three configurations, a floating electrode configuration, a plasma jet (floating electrode or two electrode), and a less common surface DBD. In a floating electrode device, the high voltage electrode is encased in a dielectric material and the treated surface acts as a ground electrode; the treated surface is exposed to high electric fields and fluxes of charged particles. The most extensively studied is the plasma jet, which uses power from pulsed dc to microwave range and where plasma effluent is carried by a gas flow to the treated surface. The plasma effluent is suitable for medical applications but requires a compressed gas supply. Surface DBD has been primarily studied as an actuator for flow control in aeronautics applications and for large area surface modifications.

Atmospheric pressure plasmas have been shown to be effective for the decontamination of surfaces from bacteria and viruses, but the level and the rate of inactivation strongly depend on the biological species, experimental conditions, and the plasma source. For example, D-value (time for 1 $\log_{10}$ reduction) is 225 s for the exposure to the gases produced by one known DBD, 150 s for another known DBD, 35 s for *E. coli* exposed to an atmospheric pressure helium/air glow discharge, and 15 s for a paper DBD. The fast reduction D=15 s was achieved by a single-use flexible DBD device using a printed patterned electrode on a paper substrate and operated at 2 kHz, 3.5 kV AC, 10 W. This is a disposable device.

Another variation on plasma disinfection is the use of low-pressure plasma activated hydrogen peroxide vapor. Systems such as the low temperature sterilization systems by Sterlis Healthcare are widely accepted methods of sterilization of materials susceptible to high temperatures, humidity, and corrosion. In more recent studies, the addition of hydrogen peroxide has been explored to enhance plasma disinfection at atmospheric pressure. Addition of $H_2O_2$ droplets into a corona discharge produced 6 $\log_{10}$ reduction, and adding $H_2O_2$ vapor to the plasma effluent produced a reduction greater than 6 $\log_{10}$ in the bacterial load and a significant reduction in biofilm and spores. The dominant mechanisms responsible for the enhancement depend on the type of plasma, the state of $H_2O_2$. $H_2O_2$ vapor is ionized in a plasma to form $H_2O_2$, while droplets may be negatively charged, a water solution of $H_2O_2$ is subject to the active species introduced by plasma into the solution akin to plasma activated water. Pure water is acidified by plasma enhancing the bactericidal effects, while buffered solutions such as phosphate buffer saline (PBS) maintain the pH level but are affected by the dissolved ozone, nitrates, and hydrogen peroxide radicals.

This diversity of results and conditions indicate a self-disinfecting fabric, that does not rely on other chemicals to provide bioactivity, is needed.

BRIEF SUMMARY

As detailed herein and in the Figures, disclosed is a self-disinfecting plasma fabric that may be employed, inter alia, for self-disinfecting Personal Protective Equipment (PPE) (such as lab coats, aprons, masks, protective sheets, gloves for an individual consumer and for medical use), for disinfecting existing PPE, being incorporated into the manufacturing of self-sanitizing PPE, self-disinfecting textiles for a wide range of medical uses (such as bandages, cover sheets, pads for wound treatment such as bed sores, treatment/prevention of skin infections, etc. and can be used alone or in conjunction with existing bandage and/or chemical wound treatments), military applications as defense against biological agents, and assisting in sanitizing surfaces in professional settings or at home. The term "fabric" as used herein is intended to cover any arrangement of fibers that are interconnected in any appropriate fashion, such as via weaving, knitting, making on a loom, etc. Preferably, the fabrics are woven fabrics, either hand-made or made on a loom.

The disclosed approach employs a dielectric barrier discharge source. The plasma source is created from insulated conductive fibers. Preferably, a pocket size high voltage high frequency power supply drives the plasma source. Plasma is produced in the natural spaces between the fibers. The plasma disinfects the fabric itself and can also disinfect other surfaces.

In contrast to the existing materials, the self-disinfecting plasma fabric disclosed herein can self-disinfect or even sterilize whenever needed with a push of a button. It doesn't require any complex equipment, and is driven by a battery operated, pocket power source. When turned on, the fabric will destroy any microbes it may have been exposed to on either side of the material as needed. This fabric is a true self-disinfecting textile material.

One aspect of the present disclosure is a fabric dielectric barrier discharge (DBD) device. The device comprises a plurality of fibers, each fiber comprising a conductive core surrounded by at least one dielectric layer, the one or more fibers forming an interconnected mesh of fiber, as well as a power supply (which is preferably a portable power supply) that is operably connected to the one or more fibers. The power supply should be configured such that plasma is capable of lighting in air gaps formed between fibers when current (preferably ≤2 mA) is applied, and preferably the temperature of the device is between about 22° C. and about 40° C.

Optionally, the fabric dielectric barrier discharge (DBD) device consists essentially of: (i) the plurality of fibers; (ii) the power supply; (iii) one or more switches; (iv) optionally one or more processors; (v) optionally one or more sensors; and (vi) optionally one or more displays or visual indicators.

Optionally, within the fabric device, at least one dielectric layer of a first fiber differs (e.g., is comprised of a different material or has a different thickness) from at least one dielectric layer of a second fiber. The fabric device may be comprised of multiple layers of interconnected fibers.

Optionally, the fabric dielectric barrier discharge (DBD) device further comprises at least one switch. A temperature sensor and/or an electrical current sensor may also optionally be incorporated. At least one processor may also be utilized, for example, a processor configured to control the power supply based on feedback from a temperature sensor and electrical current sensor.

Optionally, the fabric dielectric barrier discharge (DBD) device may be controlled by a timer. For example, it can be set to start at the press of a button and shut off automatically after a predetermined period of time (such as, e.g., 2 minutes) which has been shown to be sufficient to kill bacteria and to reduce the viability of viruses.

A second aspect of the present disclosure is a method for sterilizing surfaces. The method comprises first providing a fabric dielectric barrier discharge (DBD) device as described previously. A cold homogenous plasma can then be generated by forming a discharge path from a conductive core of a first fiber of the plurality of fibers, to the at least one dielectric layer surrounding the first fiber, to the at least one dielectric layer surrounding a second fiber of the plurality of fibers, to a conductive core of the second fiber. When the plasma comes into contact with a contaminated surface (containing, e.g., bacteria and/or viruses), it induces reactive species to form on the contaminated surface, and the reactive species are then allowed to kill the bacteria and/or viruses. In some cases, the method includes ensuring the plasma maintains contact with the surface for at least a predetermined period of time.

DETAILED DESCRIPTION

The disclosed fabric is based on low temperature plasma sterilization at atmospheric pressure by a dielectric barrier discharge (DBD). A DBD can generally be understood as a capacitively coupled plasma source with one or both electrodes covered with a dielectric material and driven often in a kHz frequency range. The dielectric barrier and high frequency of the electrical power makes the DBD safe for human contact. DBDs have been entering the medical field for wound treatment and other disinfection and treatment applications. The DBDs produce gas plasma that has bioactive properties mostly attributed to the production of reactive oxygen (ROS: O2-, OH, etc.) and nitrogen species (RNS: NO, N2O, NO3-). The effectiveness of low temperature plasma such as produced in a DBD against bacterial and viral contamination was demonstrated previously.

Figure 1:
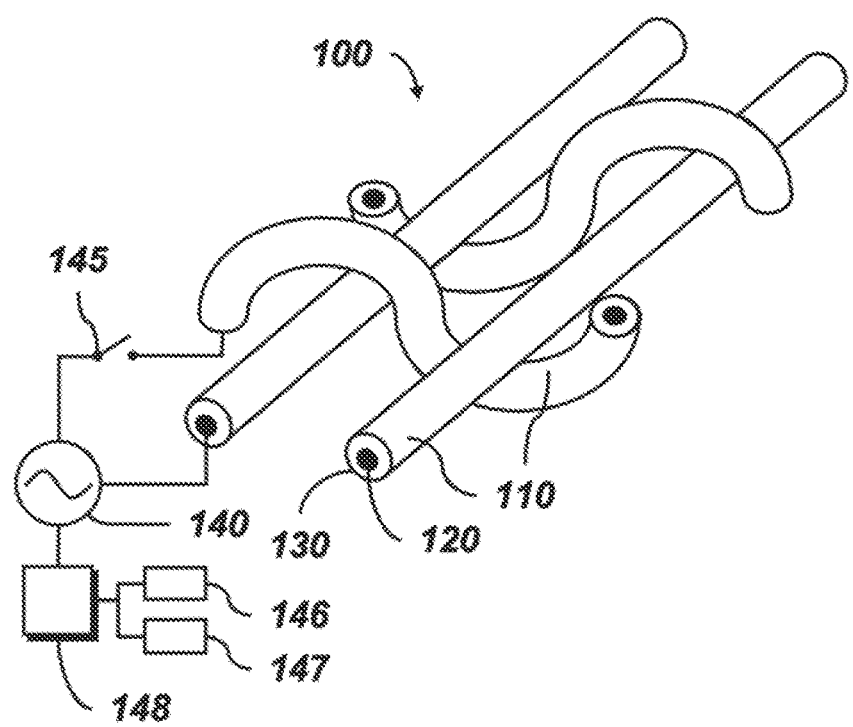
FIG. 1 is a depiction of an embodiment of a fabric dielectric barrier discharge device.

Referring to FIG. 1, embodiments of the disclosed fabric dielectric barrier device (100) can generally be considered as requiring two basic components: (i) a plurality of fibers (110) that are interconnected to form a fiber mesh (e.g., a substrate layer); and (ii) a power supply (140). Each of the plurality of fibers (110) is comprised of, consists essentially of, or consists of two components: (i) an inner conductive layer or core (120); and (ii) one or more outer dielectric layers (130) that surround the inner conductive layer.

The cross-section of each fiber may be any appropriate cross-sectional shape, such as circular, oval, or rectangular.

The inner conductive layer or core of each fiber may independently be comprised of any appropriate conductive material, including a metal, an alloy, an electric conductive compound, or a combination thereof. The inner conductive layer or core may be a single layer of a conductive material. Specific examples of such appropriate conductive materials include copper, sodium, sodium-potassium alloy, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, rare earth metals, and the like. In some embodiments, the inner conductive layer or core is carbon fiber, or a carbon coated polymer fiber. Preferably, the inner conductive layer or core are configured to have some degree of flexibility/non-rigidness.

The diameter or thickness of each inner conductive layer or core is not particular limited. Preferably, the diameter or thickness is ≤10 mm, ≤6 mm, ≤3 mm, ≤2 mm, ≤1 mm, or ≤0.5 mm. In preferred embodiments, the wires are 30 or 32 AWG gauge wires.

The one or more dielectric layers may be comprised of any appropriate dielectric material, although preferably the layers are comprised of a flexible/non-rigid material. For example, the dielectric layers may be comprised of, e.g., a polyimide, a polyamide, polytetrafluoroethylene (PTFE), polyethylene (PE), polypropylene (PP), a silicon-based material, quartz, glass, or other dielectric materials known to one skilled in the art, although quartz and glass are not preferred.

The diameter or thickness of each inner conductive layer or core is preferably ≤10 mm, ≤6 mm, ≤3 mm, ≤2 mm, ≤1 mm, ≤0.5 mm, ≤0.4 mm, ≤0.3 mm, ≤0.25 mm, or ≤0.2 mm.

Figure 2:
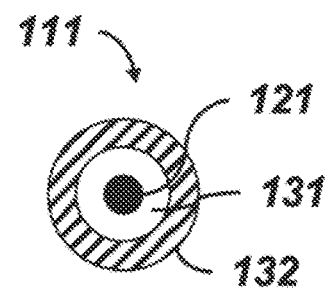
FIG. 2 is a cross-sectional view of an embodiment of a fiber with multiple layers.

Referring to FIG. 2, each fiber may comprise multiple layers, including a plurality of dielectric layers. For example, in some embodiments, a fiber (111) may comprise an inner conductive core (121) a first dielectric layer (131) comprised of a first dielectric material that surrounds and is in contact with the inner conductive core (121), and a second dielectric layer (132) comprised of a second, different, dielectric material that surrounds and is in contact with the first dielectric layer (131).

In some embodiments, one or more of the fibers include other coatings or materials. Multiple coatings could be utilized as appropriate for providing specific desired properties. Non-limiting examples include polytetrafluoroethylene (PTFE) and expanded polytetrafluoroethylene (ePTFE) and related materials, and polysiloxane or other silicon-based polymer materials. Preferably, the additional coating is an insulating material that is a flexible, malleable, low conductivity polymer.

In some embodiments, the total number of warp fibers (e.g., the fibers or portions of fibers that are oriented in the length direction of a disclosed plasma fabric) per square inch of the fabric is equal to the total number of weft fibers (e.g., the fibers or portions of fibers oriented in the width direction of a disclosed plasma fabric). In some embodiments, the total number of warp fibers is not equal to the total number of weft fibers per square inch of the fabric. The number of fibers per square inch can be varied to optimize energy consumption for the same biological or disinfecting result. For example, masks may be created that utilize a weave with fewer fibers per square inch and larger openings than for gloves.

Figure 12:
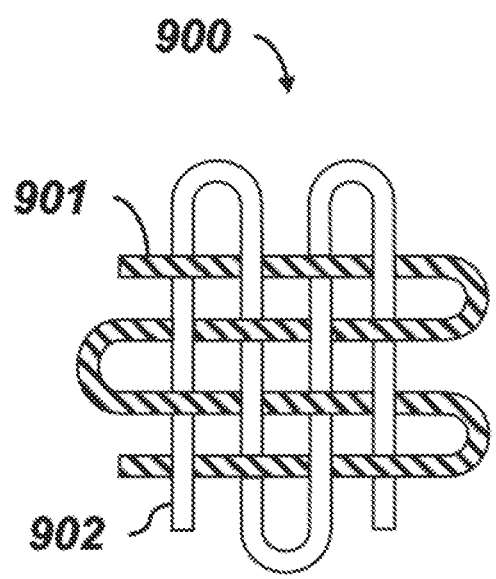
FIG. 12 is an illustration of an alternate embodiment of a fabric DBD.

In a particularly preferred embodiment, each fabric DBD uses two fibers, arranged as seen in FIG. 12. Specifically, the plurality of fibers (900) consists of two single fibers (901, 902). The first single fiber (901) passes back and forth across the fabric, where the majority of the fiber is configured to form the equivalent of, e.g., multiple weft fibers. The second single fiber (902) passes back and forth across the fabric in a perpendicular direction to the first single fiber, where the majority of the fiber is configured to form the equivalent of, e.g., multiple warp fibers. The power supply can then be connected to those two fibers, and the free end of each fiber insulated.

Figure 3:
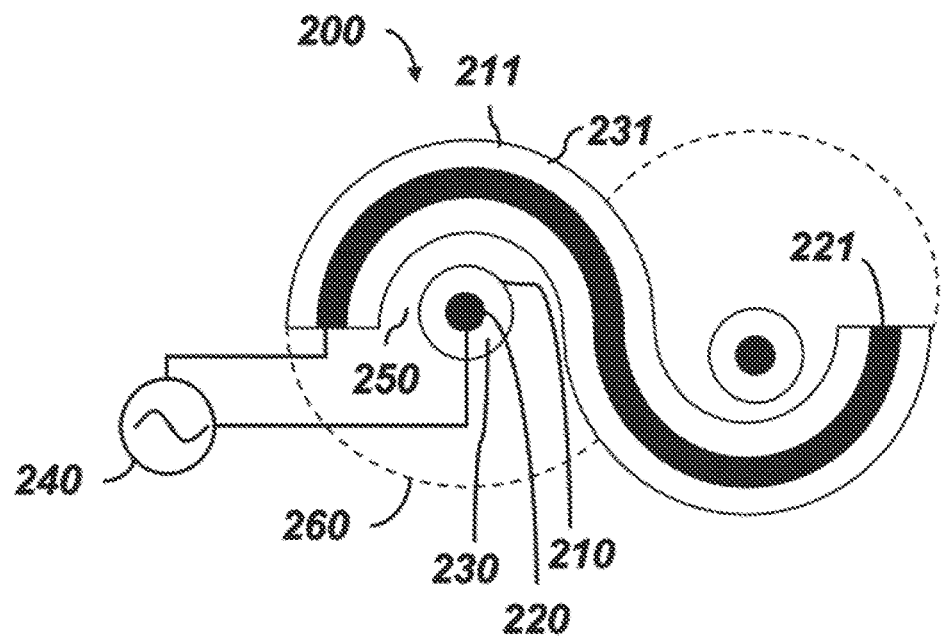
FIG. 3 is a simplified diagram of an embodiment of a fabric dielectric barrier discharge device in operation.

Referring to FIG. 3, embodiments of the disclosed fabric dielectric barrier device (200) in operation are shown. Here, due to the arrangement of the power supply and fibers, when the inner conductive layer (220, 221) of fibers (210, 211) are connected to a power supply (240) and current is applied, plasma (260) will form (e.g., "light") in and around the air gaps (250) between fibers (210, 211), filling a volume of space that encompasses a portion of two or more fibers. That is, a cold homogenous plasma can be generated by, e.g., forming a discharge path from a conductive core (220) of a first fiber (210) of the plurality of fibers, to the at least one dielectric layer (230) surrounding the first fiber, through an air gap (250) to the at least one dielectric layer (231) surrounding a second fiber (211) of the plurality of fibers, to a conductive core (221) of the second fiber.

The air gap (250) between the outer surface of one fiber and an outer surface of a second fiber is typically asymmetrical around a fiber; that is, typically one portion of the fiber may be touching another fiber, while another portion of the fiber will have a small gap, while still another portion will have an even larger gap.

In some embodiments, the air gap will be ≤10 μm, ≤5 μm, ≤4 μm, or ≤3 μm.

In some embodiments, for any given layer of fibers, each warp fiber will touch every weft fiber, and/or each weft fiber with touch every warp fiber. Even if the wires touch, at least a small air gap will be present.

The plasma generated by these devices allow the device to act as a self-disinfecting plasma cloth. The flexible cloth can be used, e.g., to repeatedly disinfect various tools, surfaces, etc., and/or itself (for example, if the fabric DBD is used as PPE, such as a mask).

Figure 4:
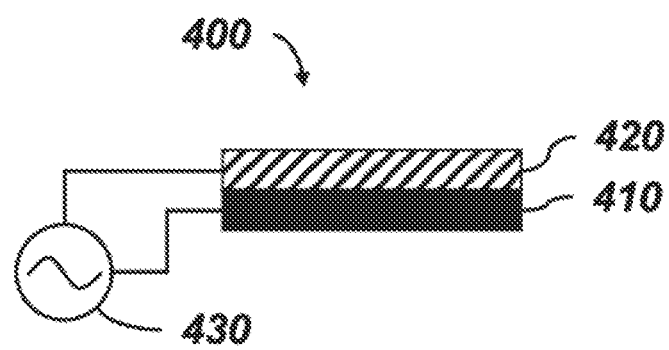
FIG. 4 is a simplified cross-sectional view of an embodiment of a fabric dielectric barrier discharge device comprising multiple layers of fibers.

Further, while FIG. 1 shows the fabric dielectric barrier device as a single layer, devices may comprise a discharge cell with a plurality of layers of first and second electrodes, where the first electrodes may be fabric through just one layer, two layers, or three or more layers as desired. In FIG. 4, the fabric dielectric barrier (400) is shown as comprising two layers (410, 420), where each layer may be the same, or different. In some embodiments, each layer is oriented such that the two-dimensional orientation of the fibers in one layer matches the two-dimensional orientation of the fibers in the other layers. That is, if one layer has fibers that are generally oriented left-to-right and top-to-bottom, the next layer has fibers that are also oriented in those directions. In some embodiments, each layer is oriented differently, such that the two-dimensional orientation of fibers from one layer do not match the two-dimensional orientation of fibers in other layers. That is, if one layer has fibers that are generally oriented left-to-right and top-to-bottom, the next layer may have fibers that are rotated 45 degrees, so the fibers are oriented bottom-left-to-top-right and bottom-right-to-top-left. Alternatively, the fibers may be twisted first and then used to make the fabric device.

Figure 5:
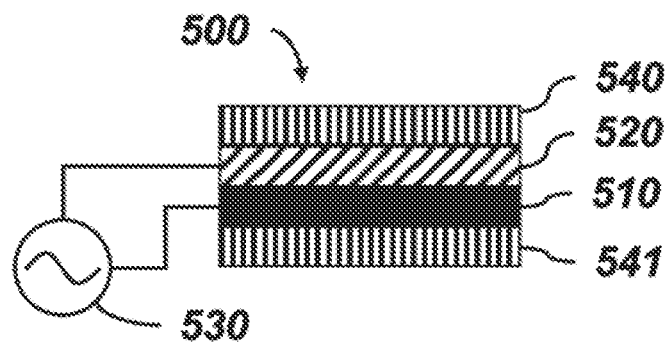
FIG. 5 is a simplified cross-sectional view of an embodiment of a fabric dielectric barrier discharge device comprising multiple layers of fibers and two semi-permeable outer layers.
Figure 6:
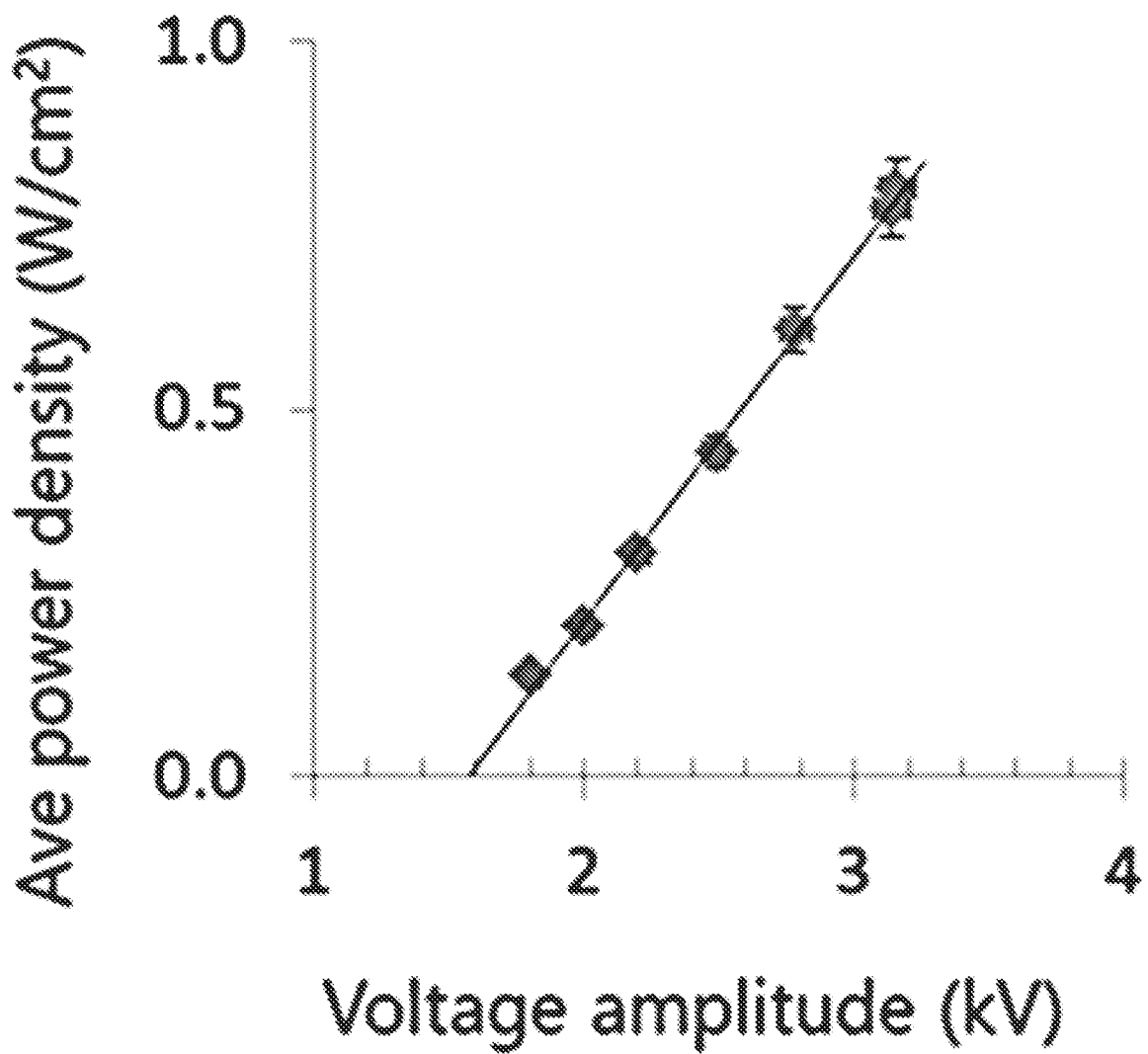
FIG. 6 is a graph showing that the average power increases linearly as a function of the applied voltage amplitude when the duty cycle and the frequency were kept constant at 20% and 40 kHz respectively.
Figure 7:
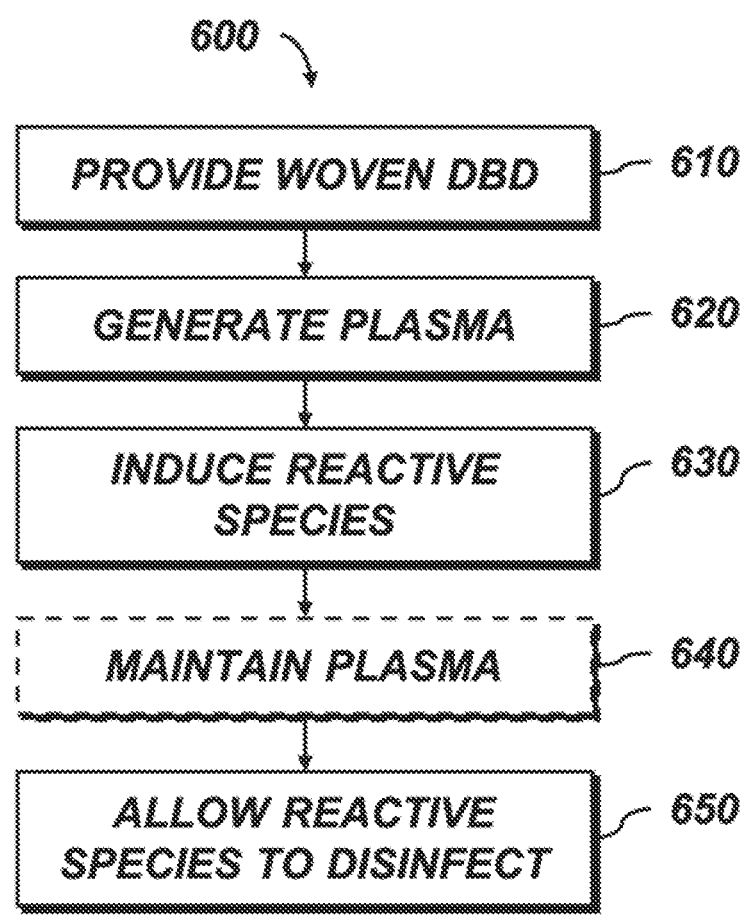
FIG. 7 is a flowchart of an embodiment of the disclosed method.

Optional semi-permeable layers, as shown in FIG. 5, may also be utilized. As seen in FIG. 5, a fabric dielectric barrier device (500) may include semi-permeable layer (540, 541), as well as one or more fabric layers (510, 520) and a power supply (530). The semi-permeable layers may take any appropriate form, including, e.g., a dielectric fabric or mesh, and may be comprised of any appropriate material, including dielectric or insulating materials. In some embodiments, the semi-permeable layer is a disposable cover around the disclosed fabric layers, and may be comprised of, e.g., polymers such as polyethylene or polypropylene.

Referring to FIG. 1, the fabric dielectric barrier device (100) is powered by a power supply (140), which may optionally be a portable power supply, and may optionally comprise, e.g., one or more batteries or supercapacitors. Any appropriate power supply is envisioned. The power source may be configured to provide AC or DC power.

The output required for the power supply is determined, in part, based on the size of the fabric DBD. Preferably, the power source is configured to provide power with a frequency between 1 kHz and 1 GHz. Preferably, the power supply is configured to provide power at voltages preferably between 100 V and 10 kV.

In some embodiments, the power source is relatively small (e.g., within a housing that is 4 cubic inches or smaller).

Because all conductive threads are insulated, they do not need to be grounded, so the user is protected by the insulation.

In some embodiments, the power supply is configured to provide a current that is less than or equal to 2 mA. The power supply is connected to the electrodes using any appropriate means, including via, e.g., wire, conducting thread, or conducting tape. The opposite electrodes are connected to group via any appropriate means, including via, e.g., The power supply is connected to the electrodes using any appropriate means, including via, e.g., wire, conducting thread, conducting tape, or fabric strips at the ends of the fibers.

These devices are preferably free of any additional gas supply or sophisticated power sources and are preferably configured to be capable of long-term stable operation (i.e., at least a month, preferably at least 2 months, and more preferably at least 3 months).

In some embodiments, the power supply is controlled or configured to provide current such that the temperature of the device is maintained at ≤50° C., or ≤40° C., and ≥15° C., or ≥22° C. In some embodiments, the power supply is controlled or configured to provide current such that the temperature of the device is maintained at between about 15° C. and about 50° C., and more preferably between about 22° C. and about 40° C. As used herein, the term "about" a temperature indicates values generally within ±5%, as appropriate (e.g., a lower range limit is −5% and an upper range limit being +5%). For example, "between about 10° C. and about 100° C." would be intended to cover between 9.5° C. and 105° C.

The fabric dielectric barrier device (100) may optionally contain additional components, including one or more switches or other electrical component (145) for controlling the electrical current to the fibers, one or more sensors (146), one or more displays or visual indicators (147), and one or more processors (148). The one or more processors (148) will be configured to operably communicate with one or more of the various components in the system, such as the power supply (140), the sensor(s) (146), and/or the displays or visual indicators (147).

In preferred embodiments, the device will include at least one switch (145) configured as a power on/off switch.

If one or more sensors (146) are included, such sensors may operably communicate with the one or more processors (148) or the one or more displays or visual indicators (147). For example, a temperature sensor may be connected to a warning light through some basic circuitry (well-understood in the art), such that when the temperature exceeds a threshold, the warning light turns on. In some embodiments, the sensor(s) may send feedback about the temperature and current to the processor(s), which the processor(s) then use to determine if the current needs to be adjusted, and if so, by how much, or if a malfunction has occurred. Based on that determination, the processor(s) can then cause the power supply (140) to turn off or adjust the current, and/or cause an indication of a problem to appear on a display or an indicator light (147).

In addition, one or more surfaces or portions of the device may also have their temperature or other parameter measured or monitored, periodically or continuously, by a temperature sensor (146). In some embodiments, a surface of the dielectric layer of one or more fibers may be monitored by a sensor. Any appropriate sensor, such as a thermocouple, may be utilized.

The displays or visual indicators (147) may include any known display or visual indicator, including color or monochrome LED/OLED displays and/or LED lights. To maximize battery life, the displays or visual indicators are preferably small, low-powered, or only intended to be "on" for a short period of time (such as 1 minute or less).

The one or more processors or control circuitry (148) may be present for controlling the generation of plasma and/or other components of the device. The processors or control circuitry may be operably connected to the temperature sensor (146) and the power supply (140). The processors or control circuitry may be configured to maintain an appropriate operating temperature, as discussed previously. The processors or control circuitry may be configured to have an automatic safety shut-off, if the temperature is detected as being outside a target range or exceeding a threshold. The safety shut-off may also be configured to occur if the voltage or current exceeds certain thresholds.

As an example of a discharge device in operation, a typical current trace is comprised of a displacement current sinusoidal component of, e.g., (42±2) kHz and the superimposed sharp spikes, e.g., 10-50 ns in duration corresponding to the discharges. The displacement current can be subtracted from the total measured current to obtain the discharge current. The number of discharges, their overall duration, and their amplitude may increase with increasing voltage.

The number of individual discharges or current peaks varies depending on the maximum applied voltage (overvoltage). For example, in some embodiments, the number of current peaks (over 10 mA) is 15±8 at 2 kV and increases to 45±8 for 3 kV.

The greater number of current spikes results in a greater amount of charge transferred in the circuit as evident from a Lissajous plot. The Lissajous plot has a two-slope shape with a slight asymmetry due to a greater number of more intense discharges for the negative voltage (positive patterned electrode). The energy dissipated in the circuit per one cycle can be calculated as the area of the Lissajous plot, and the power, P, is then determined using the frequency, f, the duty cycle, v: $P=fv\oint QdV$, where Q is the charge measured by the capacitor probe and dV is the voltage obtained by the high voltage probe.

For example, for the peak voltage of 1.9 kV the energy per cycle was 0.04 mJ/cycle. For the frequency of 41 kHz and a 20% duty cycle this gives the power of 0.3 W. For the max voltage of 2.9 kV the energy per cycle was 0.14 mJ/cycle, and the power, 1.1 W. The corresponding power density for the ~2 $cm^2$ device is 0.15-0.5 $W/cm^2$. The applied max AC voltage was varied from 1.6 kV to about 3 kV while keeping the frequency and the duty cycle constant. The resulting power varied linearly (see FIG. 8) with the applied voltage, which can be used as a calibration curve to set the desired power for a given device. Increasing the operating voltage increases the discharge power and corresponds to an increase in the number of individual discharges and the production of plasma. Increasing the duty cycle increases the overall power consumption by the device but does not change the number of individual discharges per cycle.

In some embodiments, any gap between the outer-most dielectric layer and a target surface to be disinfected is ≤2 cm, and preferably ≤1 cm, and more preferably ≤5 mm, and most preferably ≤2 mm. In some embodiments, the gap is ≤1 mm. In some embodiments, the gap is between 1 μm and 2 mm, and preferably between 1 mm and 2 mm.

Example

Several examples were woven on a hand loom. The fibers that were used consisted of 32 American Wire Gauge (AWG) copper wires as the conductive cores, each surrounded by flexible silicone. In some examples, the weave was tight, with the fibers touching each other. In other samples, the spacing between each weft fiber and between each warp fiber was between 1 and 2 mm. These examples are suitable for making disinfecting bags for personal items and/or incorporating in wound dressings.

Figure 9:
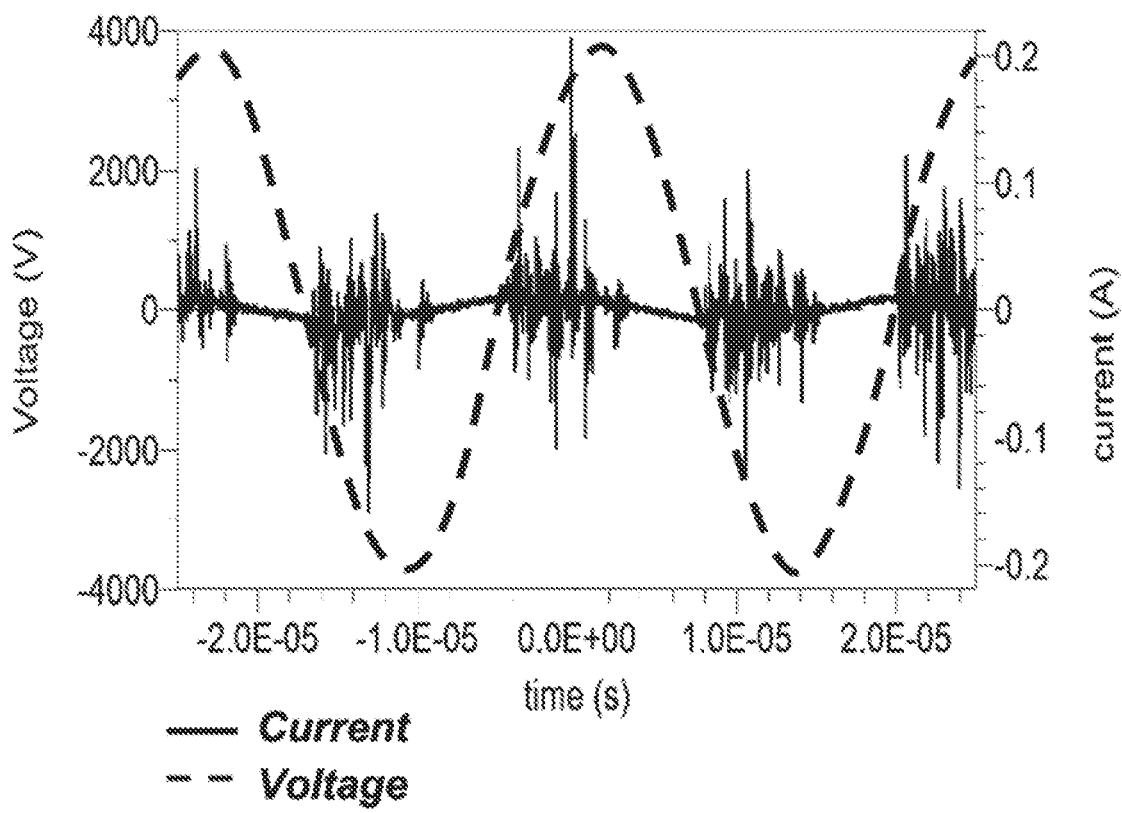
FIG. 9 is a graph showing current and voltage traces recorded during operation for an embodiment of a fabric DBD, where the operational parameters were as follows: $V_{max}$=3.8 kV, 40.7 kHz, 25% duty cycle, 0.1 a mJ/cycle

Also disclosed is a method for sterilizing surfaces, comprising. As seen in FIG. 9, one embodiment of the method (600) beings by providing (610) a disclosed fabric dielectric barrier discharge (DBD) device.

The device is then activated, and a cold homogenous plasma is generated (620). This generation process occurs by forming a discharge path from a conductive core of a first fiber of the plurality of fibers, to the at least one dielectric layer surrounding the first fiber, and through an air gap (the plasma will light in and around the air gap). The discharge path preferably continues to the at least one dielectric layer surrounding a second fiber of the plurality of fibers, to a conductive core of the second fiber. In some embodiments, the discharge path may not continue to a second fiber, but towards and through a human being. The air gap between the fiber and the human being (or clothing, etc.) may allow plasma to be formed.

Once the plasma is formed in a volume of space around the air gaps, reactive species can be induced to form (630) on a contaminated surface by contacting the contaminated surface with the generated cold homogenous plasma. The contaminated surface will typically contain bacteria, viruses, or a combination thereof. It may also contain other biological species, such as fungi. The contaminated surface may be an outer surface of a fiber within the disclosed fabric DBD, or it may be an external surface, such as human skin, a work surface, etc.

Optionally, the method may include keeping or maintaining (640) the plasma's contact with a contaminated surface for at least a predetermined period of time, such as at least 1 second, at least 5 seconds, or at least 10 seconds.

The reactive species are then allowed (650) to kill the bacteria, viruses, or combination thereof on the contaminated surface.

Example 2

The antibacterial effect of a plasma fabric device was tested using *E. coli* as model bacteria. For this example, *E. coli* OP-50-GFP strain was used because this strain expresses green fluorescent protein and forms a dense lawn when spread on an LB agar plate. Bacteria that have been killed cannot express this protein and therefore do not glow green.

Figure 8:
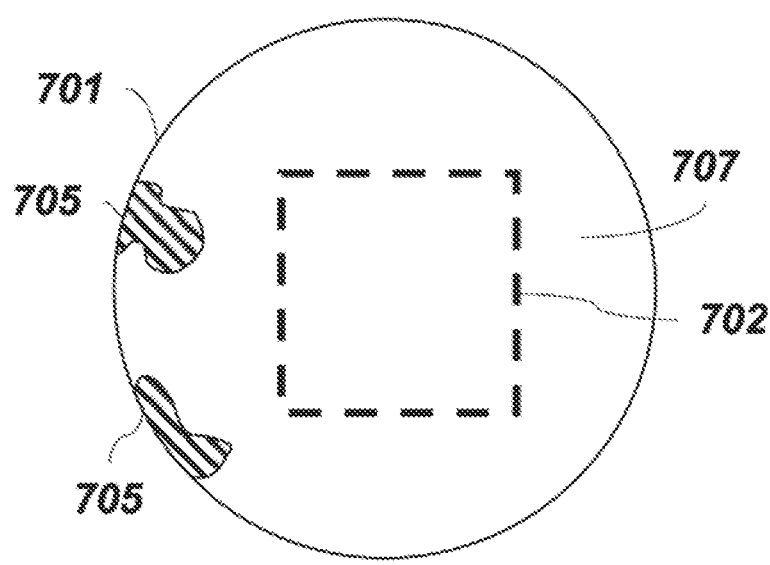
FIG. 8 is an illustration of the disinfection of bacteria in a region that is greater than the size of a woven DBD after 120 seconds of exposure.

At time=0, the entire agar plate fluoresced green. After 30 seconds, roughly 97% of the plate area under the fabric device was cleared of bacteria, and approximately 70% of the total plate area was cleared of bacteria. After 60 seconds, over 99% of the plate area under the fabric device was cleared of bacteria, and approximately 85% of the total plate area was cleared of bacteria. FIG. 8 shows the results graphically, after 120 seconds of exposure. Specifically, on the agar plate (701), the outline (702) of where the fabric device was placed is shown. As is seen, the only bacteria (705) in the agar plate is a small amount at the edges of the plate, away from the fabric device. There is a large region (707) of space around where the fabric device was placed that is free of bacteria. Indeed, 100% of the plate area under the fabric device was cleared of bacteria, and approximately bacteria was completely eliminated on 97% the total plate area.

Figure 10:
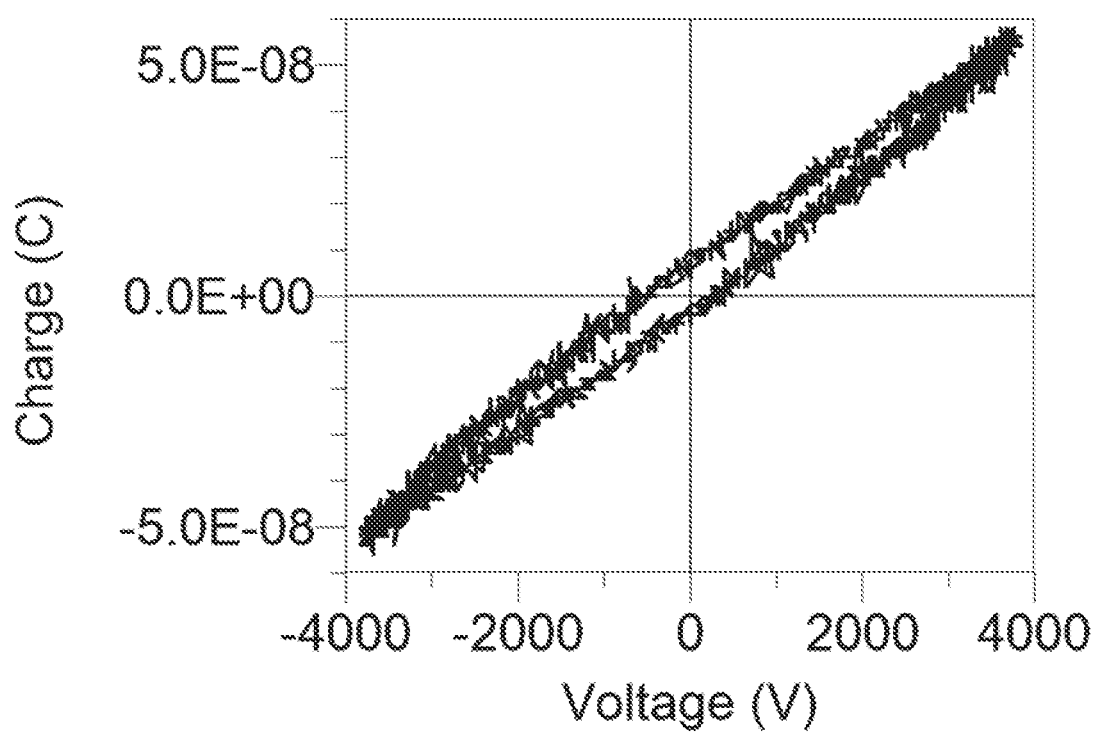
FIG. 10 is the Lissajous figure corresponding to the current and voltage traces of FIG. 9.

The fabric device used in this example was a ~2.5 $cm^2$ device, with ~10 fibers per cm. The weave was made of two continuous silicon insulated 30-gauge wires. One end of each wire/fiber was connected to the output of a kHz range, AC power source. The voltage and current traces are shown in FIG. 9. The charge transferred was also measured using a 10 nF measurement capacitor in series with the device. Lissajous figures (FIG. 10) were used to find energy per cycle, E. The average power of the device was calculated as, $P=v \cdot fE$, v—duty cycle as a fraction of on time, f—frequency (Hz), E—energy per cycle (J). The graph shown in FIG. 10 corresponds to Vmax=3.8 kV, 40.7 kHz, 25% duty cycle, 0.1 mJ/cycle, ~1 W, 0.4 $W/cm^2$ for the area of the weave.

After the successful decontamination of the bacteria, the fabric device was then tested against viruses. additional experiments were performed.

Figure 11:
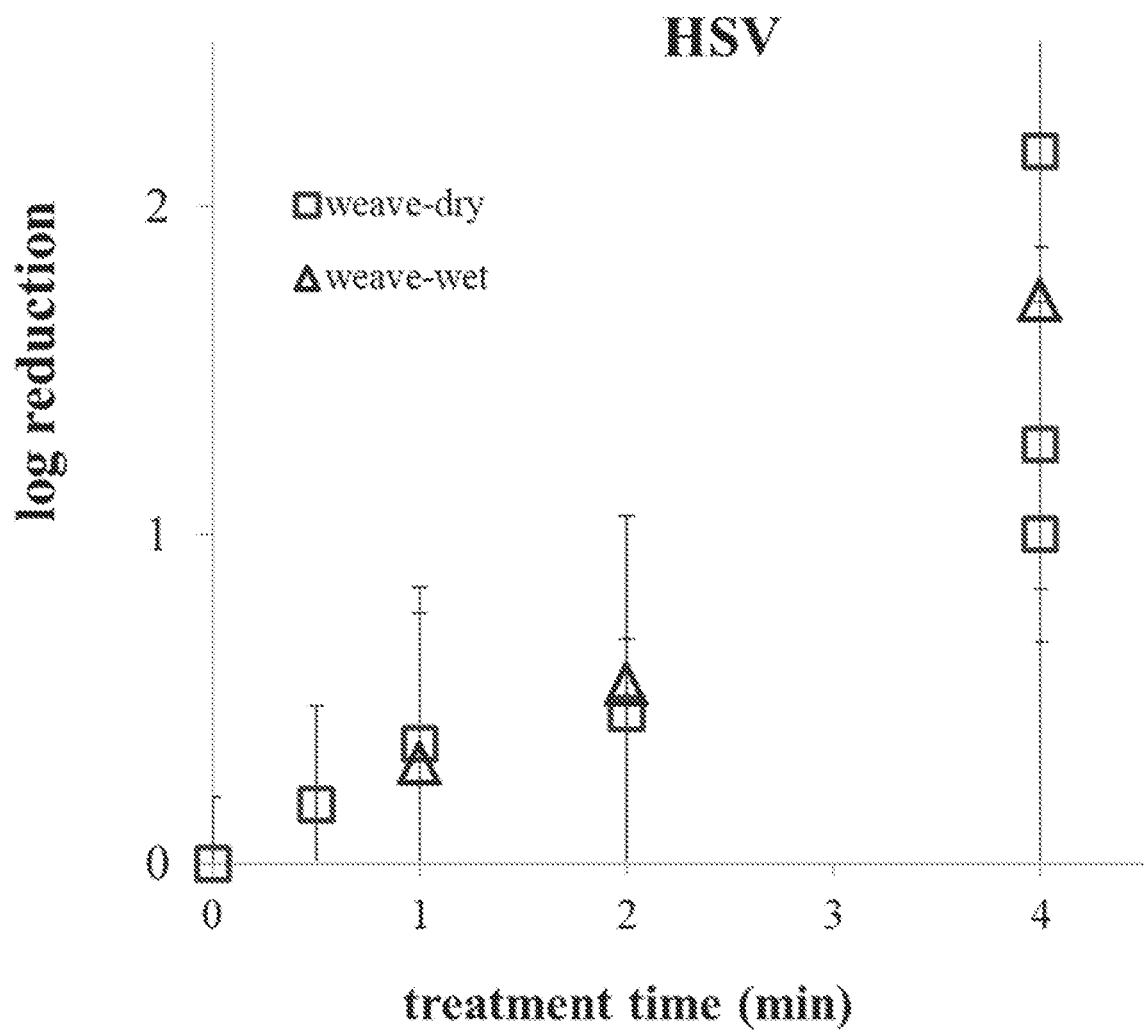
FIG. 11 is a graph showing the reduction in viral load in a dry and liquid suspension of a herpes simplex virus (HSV) after exposure to an embodiment of a fabric DBD. The error bars are based on three repeated trials for each condition.

Virus disinfection experiments were conducted using herpes simplex virus (HSV). Droplets of virus suspension were placed in 30 mm diameter petri dishes and dried for approximately 20 min until visually dry. Petri dishes with the dry suspension were inverted on top of a holder with the fabric DBD ("weave"), so that the weave was in a contact with the dried suspension. Immediately after each treatment, 1 mL of a buffer solution was added to the petri dish to immediately stop the reaction. The resulting virus suspension was used to determine the concentration of the plaque forming units and compare to the untreated suspension. The weave demonstrated a 99.3% reduction in viable virus after a 4 min treatment (see FIG. 11)

Additionally, because disinfection and other biological results is dependent on gas output of the device, an experiment was run to confirm the output of biologically active species, using Fourier Transform Infrared Absorption Spectroscopy.

To determine the output of biologically active species, the fabric DBD in this example was placed in a gas cell (10 cm optical path) and turned on. FTIR absorption spectra were taken during operation at different conditions including lower and higher voltage and power. The spectra was used to identify the molecular species present in the gas outflow from the device and to calculate the absolute concentrations of ozone, and nitrogen oxides, important for disinfection and other biomedical applications. For example, at 0.175 mJ/cycle, the following concentrations were determined, $O_3$—$8.2 \times 10^{15}$ $cm^{-3}$ (0.09%), and $N_2O$—$6.75 \times 10^{13}$ $cm^{-3}$ (0.003%). The concentration of $O_3$ decreased and $N_2O$ increased with increased power. Thus, the composition of the device output depends on the input power.

By adjusting the power for a given desired outcome, this implies a user can "dial in" the device to provide a desired composition of gas output. For example, to kill a species that is more affected by ozone than nitrogen oxides, it would be more effective to use lower power input. In some embodiments, one or more processors on the device could have access to various databases or tables containing, e.g., curves correlating input power with gas output, and other databases or tables correlating biological species with time to kill a certain percentage (e.g., 99%) of a given species of bacteria when exposed to various output gasses (ozone, nitrogen oxides, etc.). Based on those databases, the device can calculate or otherwise determine the optimal input power to kill the bacteria, by identifying the input power that generates the gas composition that kills one or more targeted bacteria in an effective manner.

Those skilled in the art will recognize or be able to ascertain using no more than routine experimentation many equivalents to the specific embodiments of the invention described herein. Such equivalents are intended to be encompassed by the following claims.

What is claimed is:

1. A fabric dielectric barrier discharge (DBD) device, comprising:
   a plurality of fibers forming an interconnected woven mesh of fibers, where each individual fiber of the plurality of fibers independently includes a conductive core surrounded by a first dielectric layer; and
   a power supply operably connected to the one or more fibers, the power supply configured such that plasma is capable of lighting in air gaps of ≤10 μm formed between fibers when current is applied.

2. The fabric dielectric barrier discharge (DBD) device according to claim 1, wherein the device consists essentially of:
   the plurality of fibers;
   the power supply;
   one or more switches;
   optionally one or more processors;
   optionally one or more sensors; and
   optionally one or more displays or visual indicators.

3. The fabric dielectric barrier discharge (DBD) device according to claim 1, wherein each fiber comprises a conductive core surrounded by one or more dielectric layers including the first dielectric layer, and wherein at least one dielectric layer of a first fiber of the plurality of fibers is different from at least one dielectric layer of a second fiber of the plurality of fibers.

4. The fabric dielectric barrier discharge (DBD) device according to claim 1, wherein each fiber comprises a conductive core surrounded by one or more dielectric layers including the first dielectric layer, and wherein at least one dielectric layer of each fiber of the plurality of fibers is identical.

5. The fabric dielectric barrier discharge (DBD) device according to claim 1, wherein the power supply provides AC voltage.

6. The fabric dielectric barrier discharge (DBD) device according to claim 1, wherein the power supply provides DC voltage.

7. The fabric dielectric barrier discharge (DBD) device according to claim 1, wherein the power supply provides voltage with a pulse frequency between 1 kHz and 1 GHz.

8. The fabric dielectric barrier discharge (DBD) device according to claim 1, wherein the device comprises a plurality of layers of interconnected fiber.

9. The dielectric barrier discharge (DBD) device according to claim 8, further comprising a temperature sensor and an electrical current sensor.

10. The dielectric barrier discharge (DBD) device according to claim 1, wherein the DBD device is powered by a portable power supply.

11. The dielectric barrier discharge (DBD) device according to claim 10, further comprising at least one processor configured to control the power supply based on feedback from the temperature sensor and electrical current sensor.

12. The dielectric barrier discharge (DBD) device according to claim 1, wherein the current is less than or equal to 2 mA.

13. The dielectric barrier discharge (DBD) device according to claim 1, wherein the temperature of the device is between about 22° C. and about 40° C.

14. The dielectric barrier discharge (DBD) device according to claim 1, further comprising at least one switch.

15. A method for sterilizing surfaces, comprising:
   providing a fabric dielectric barrier discharge (DBD) device comprising:
      a plurality of fibers forming an interconnected woven mesh of fibers, where each individual fiber of the plurality of fibers independently includes a conductive core surrounded by a first dielectric layer; and
      a power supply operably connected to the one or more fibers, the power supply configured such that plasma is capable of lighting in air gaps formed between one or more fibers when current is applied, each air gap being ≤10 μm;
   generating a cold homogenous plasma by forming a discharge path from a conductive core of a first fiber of the plurality of fibers, to at least one dielectric layer surrounding the conductive core of the first fiber, through an air gap towards a second fiber of the plurality of fibers or a human being;

inducing reactive species to form on a contaminated surface by contacting the contaminated surface with the generated cold homogenous plasma, the contaminated surface containing bacteria, viruses, or a combination thereof; and allowing the reactive species to kill the bacteria, viruses, or combination thereof.

16. The method according to claim 15, wherein the discharge path forms from the conductive core of the first fiber of the plurality of fibers, to the at least one dielectric layer surrounding the conductive core of the first fiber, through an air gap to at least one dielectric layer surrounding a conductive core of a second fiber of the plurality of fibers, to the conductive core of the second fiber.

17. The method according to claim 15, further comprising keeping the plasma in contact with a contaminated surface for at least a predetermined period of time.

18. The method according to claim 15, further comprising self-disinfecting when the cold homogenous plasma is generated.

* * * * *